United States Patent [19]
Han

[11] Patent Number: 5,839,456
[45] Date of Patent: Nov. 24, 1998

[54] WAFER WET TREATING APPARATUS

[75] Inventor: Suk Bin Han, Chungcheongbuk-do, Rep. of Korea

[73] Assignee: LG Semicon Co., Ltd., Chungcheongbuk-do, Rep. of Korea

[21] Appl. No.: 914,794

[22] Filed: Aug. 20, 1997

[30] Foreign Application Priority Data

Dec. 24, 1996 [KR] Rep. of Korea ................. 1996 71487

[51] Int. Cl.⁶ ........................................ B08B 3/04
[52] U.S. Cl. ................. 134/104.1; 134/111; 134/183; 134/902
[58] Field of Search .................. 134/104.1, 111, 134/152, 185, 183, 902; 156/345 L

[56] References Cited

U.S. PATENT DOCUMENTS

| | | | |
|---|---|---|---|
| 5,261,431 | 11/1993 | Ueno et al. | 134/902 X |
| 5,485,861 | 1/1996 | Hiratsuka et al. | 134/182 |
| 5,511,569 | 4/1996 | Mukogawa | 134/104.1 |
| 5,709,235 | 1/1998 | Akanuma et al. | 134/902 X |

FOREIGN PATENT DOCUMENTS

| | | | |
|---|---|---|---|
| 123730 | 7/1983 | Japan | 156/345 L |
| 26028 | 1/1990 | Japan | 134/186 |
| 253332 | 9/1992 | Japan | 134/902 |
| 967598 | 10/1982 | U.S.S.R. | 134/182 |

OTHER PUBLICATIONS

Yusuke Muraoka, Room Temperature Wet Cleaning Technology, 26th Symposium on ULSI Ultra Clean Technology, Dec. 1–2, 1995, pp. 134–142.

*Primary Examiner*—Philip R. Coe
*Attorney, Agent, or Firm*—Morgan, Lewis & Bockius LLP

[57] ABSTRACT

A wafer wet treatment apparatus includes a first supply/discharge line, an outer bath connected to the first supply/discharge line, an inner bath within the outer bath, a second supply/discharge line connected to the inner bath, and at least one partition located on a portion of the inner bath.

13 Claims, 11 Drawing Sheets

WAFER WET TREATING APPARATUS

BACKGROUND OF THE INVENTION

1. Field of the Invention

The present invention relates to a wafer wet treatment apparatus, and more particularly, to a wafer wet treatment apparatus used in a semiconductor device manufacturing process.

2. Discussion of the Related Art

In a wafer (thin round plate) wet treatment process of a semiconductor device manufacturing process, there are an etching process and a cleaning process. A wafer wet treatment apparatus used in an etching process dips a wafer in a bath filled with chemicals for inducing a chemical reaction during a fixed time. A wafer wet treatment apparatus used in a cleaning process causes a chemical solution that overflows in a bath to discharge from an outer tank (or bath) or recirculate. The wet etching apparatus is composed of pipes which supply or discharge chemicals in the bath, and various kinds of control means for controlling temperature or flux. The cleaning apparatus is divided into an overflow-type and a downflow-type in accordance with the flow direction of the chemical solution in the bath, as shown in FIG. 1.

As depicted in FIG. 1, the cleaning apparatus includes an inner bath (cleaning bath) 11 and an outer bath (discharging or injecting tub) 12. The upper portions of the inner bath and the outer bath are exposed, and the lower portions of the inner bath and the outer bath are connected to a discharging or inserting 14 pipes. In the overflow-type cleaning apparatus, the chemical solution flows through the pipes in the direction of the arrows shown in FIG. 1, while it flows in the opposite direction in the downflow-type apparatus.

In the overflow-type apparatus, a wafer 5 loaded on a wafer cassette or boat 6 is installed in the inner bath, and the chemical solution inserted through a solution supply line 14 cleans the wafer, then overflows into the outer bath, and is discharged through a discharge line 15. The solution discharged recirculates by means of a pump, or is discharged into a storage tank. But in the downflow-type apparatus, the solution flows in the opposite direction. FIG. 2 simply illustrates a cleaning apparatus with a plurality of cleaning baths. This apparatus comprises four of the cleaning baths shown in FIG. 1 which are, connected in a row with one another. The treatment method using this apparatus includes the steps of: 1) dipping the wafer in the first cleaning bath 21 for a certain treatment; 2) chemically treating the wafer in the second cleaning bath 22; 3) moving the wafer into the third cleaning bath for the next treatment; and 4) treating the wafer in the fourth bath in the same way.

FIG. 3 roughly shows the downflow-type wet cleaning apparatus. In the downflow-type apparatus, a wafer 5 loaded on a wafer cassette or boat 6 is installed in the inner bath 31, and the chemical solution is inserted into the outer bath 32 through a solution supply main line 34, then overflows into the inner bath, and is discharged through a discharge line 35 located under the inner bath. The solution discharged is inserted into the outer bath by a recirculating device having a filter, a pump, etc., and then recirculates, or is discharged into a storage tank of the solution for discharging.

The solution main supply line 34 is connected to a plurality of solution supply lines 36, the respective solution supply lines are connected so that the solution may be supplied from the respective chemical tank 37. In the chemical tank, the solution is supplied by nitrogen pressure resulting from a nitrogen tank 38. Also, the solution main supply line is connected to a distilled water supply line 39 through a regulator 40. The solution main supply line is connected to the respective solution supply lines through control valves.

In the downflow-type wet cleaning apparatus having such a structure, the solution main supply line, the outer bath and the inner bath are cleaned with distilled water, and the chemical solution is supplied in the inner bath where the wafer is installed and the outer bath so that the wet treatment is performed. This treatment is performed by valves controlled manually or operated automatically.

The technique and apparatus for treating the wafer have become very important in the semiconductor device manufacturing industry in recent years, in accordance with the high integration of semiconductor device. This is because the treatment efficiency of the wafer is reduced and chips with very poor quality are made due to contaminants affecting the reliability of semiconductor devices. Also, the solution tank of the cleaning apparatus based in the conventional art is becoming larger in accordance with an increase in wafer diameter. Thus, optimum sizes of parts and bath of the apparatus are required for diminishing the size of the apparatus. In a multistage wet cleaning process of a conventional art, chemicals used in the preceding process and particles induced during conveyance, are accumulated between grooves of the wafer boat. As a result, these particles act as contaminants.

The wafer is treated with a certain chemical solution in the first process, treated with the next chemical solution in the next bath to which it is moved, treated with a different cleaning solution in the following process, and finally treated in a distilled water bath. A separate bath is needed in each process, and a distilled water bath system should vary in accordance with the respective baths. The problems of a system with multiple baths used in such a multistage treating process are that the whole area of the apparatus becomes larger, the size of the bath become larger in accordance with the wafer's diameter extension, and the whole area occupied by the apparatus increases due to the increasing capacity of the bath.

A one-bath system has been employed to solve the above problems, in recent years. The one bath system uses only one bath in each process, but use the respective chemical solutions required in each process. Therefore, unlike a multiple bath system various processes are made in the same bath so that the number of multiple baths can be reduced in this system.

However, the one bath system to reduce the whole size of the basic bath system has a problem which is caused by various chemical solutions used in the same bath in each process. For example, the chemical solution used in a preceding process is completely removed, and the inside of the bath is cleaned with distilled water, etc. After the next chemical solution introduced into the bath, and the primary treatment process is done in the bath, the next real process is done by stet chemical solution introduced. Therefore, this results in a prolonged preparatory time prior to the treatment processes, and enormous chemical solution or distilled water is consumed. Also the residual chemical solution adhering on the walls of the bath may not be completely removed so that the reliability in the next process deteriorates.

Even if the one bath system is exclusively used in the distilled water cleaning process, the problem of consuming an enormous amount of chemical solution in order to remove the residual chemical solution in the entire process.

SUMMARY OF THE INVENTION

Accordingly, the present invention is directed to a wafer wet treatment apparatus that substantially obviates one or more of the problems due to limitations and disadvantages of the related art.

An object of the present invention is to provide a wafer wet treatment apparatus which prevents a wafer from being contaminated with contaminants.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a wafer wet treatment apparatus includes a first supply/discharge line; an outer bath connected to the first supply/discharge line; an inner bath within the outer bath; a second supply/discharge line connected to the inner bath; and at least one partition located on a portion of the inner bath.

In another aspect of the present invention, a wafer wet treatment apparatus includes a supply line; an outer bath connected to the supply line; an inner bath within the outer bath; a discharge line connected to the inner bath; and at least one partition located on a portion of the inner bath.

In another aspect of the present invention, a wafer wet treatment apparatus includes a discharge line; an outer bath connected to the discharge line; an inner bath within the outer bath; a supply line connected to the inner bath; and at least one partition located on a portion of the inner bath.

In another aspect of the present invention, a method for treating a wafer in a wet wafer treatment apparatus including an outer bath, an inner bath, a supply line, a discharge line, and at least one partition, includes the steps of supplying a first solution to the inner bath through the supply line and the outer bath; discharging the first solution from the inner through the discharge line; removing the at least one partition from the inner bath; supplying a second solution to the inner bath through the supply line; and discharging the second solution through the discharge line.

In a further aspect of the present invention, a method for treating a wafer in a wet wafer treatment apparatus including an outer bath, an inner bath, a supply line, a discharge line, and at least one partition, includes the steps of supplying a first solution to the inner bath through the supply line; overflowing the first solution to the outer bath; discharging the first solution from the outer bath through the discharge line; removing the at least one partition from the inner bath; and supplying a second solution to the inner bath.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF THE PREFERRED EMBODIMENT

Reference will now be made in detail to the preferred embodiments of the present invention, examples of which are illustrated in the accompanying drawings.

Figure 1:
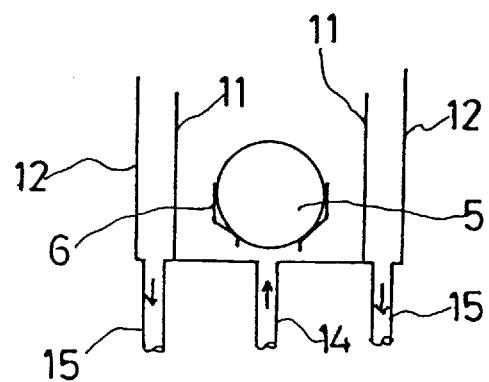
FIG. 1 shows a conventional overflow-type cleaning apparatus.
Figure 2:
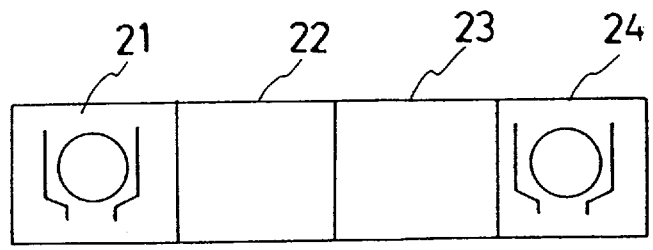
FIG. 2 shows a conventional wafer treatment apparatus having a plurality of wet treatment baths.
Figure 3:
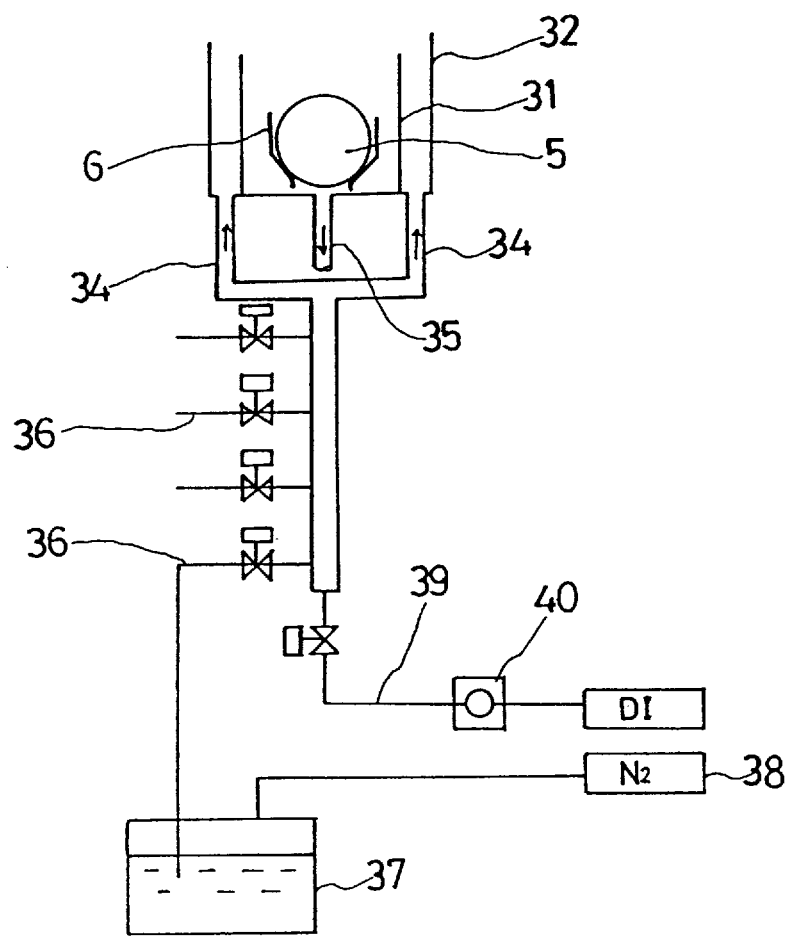
FIG. 3 shows a downflow-type wet treatment system.
Figure 4:
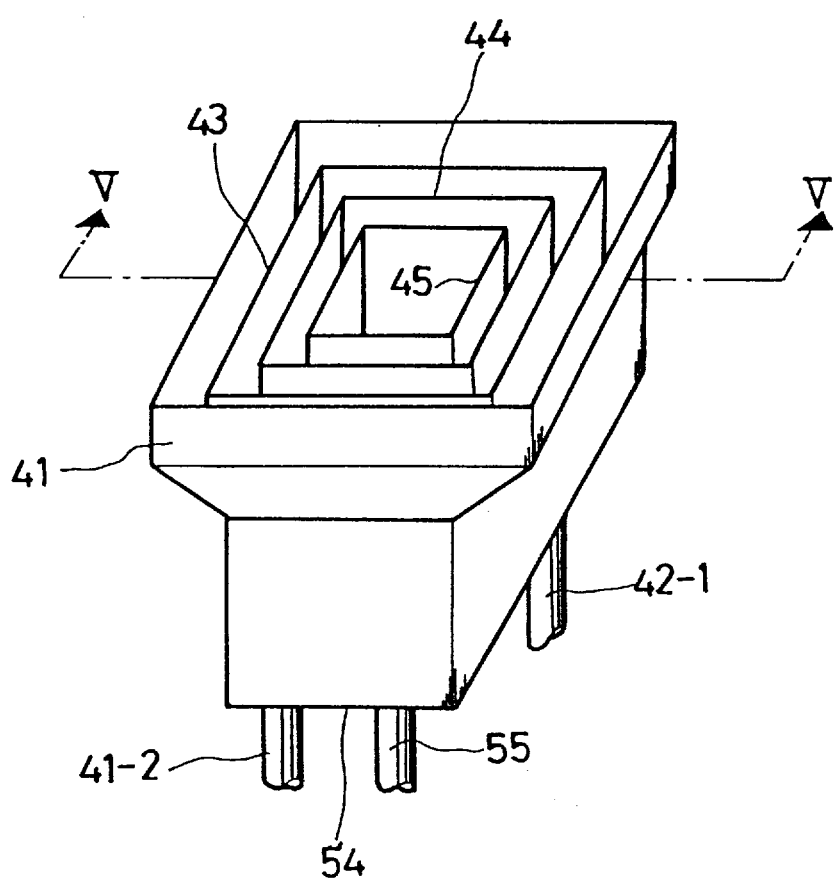
FIG. 4 is a perspective view of a wafer wet treatment apparatus of the present invention.
Figure 5:
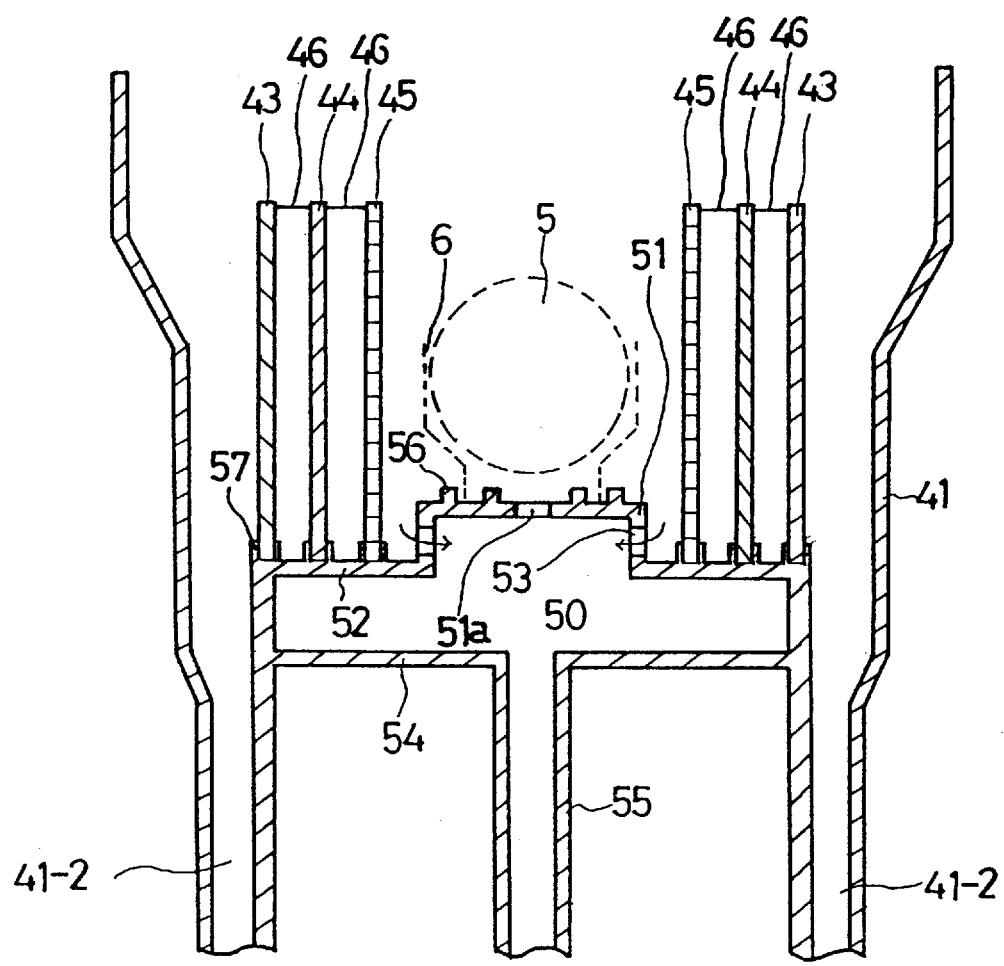
FIG. 5 is a cross-sectional view taken along the line stet of FIG. 4.

Referring to FIGS. 4 and 5, a wafer wet treatment apparatus comprises an outer bath 41, an inner bath bottom portion 50 located inside of the outer bath, and a plurality of partitions 43, 44 and 45 located extending from the inner bath bottom portion 50.

A output/input path 41-2 for chemical solution which is induced or flows between the inner bath and the outer bath, is formed at a bottom portion 41-1 of the outer bath 41.

At the center of the inner bath bottom portion 50, a wafer support 51 for mounting a wafer is disposed higher than a partition support 52 so that the inner bath bottom portion 50 has two levels in height. A plurality of apertures 53 through which chemical solution passes, are formed at the sides of the wafer support. A wafer carrier 6 is mounted on the wafer support 51 as shown with dotted line in FIG. 5. The upper side of the wafer support and the wafer carrier 6 for holding a wafer 5 preferably has protrusions 56 in order to facilitate the attachment of the wafer carrier to the wafer support 51. An inner bath bottom lower plate 54 is installed under the partition support 52 for attaining a fixed volume of space to gather the chemical solution which passed through the apertures 53 formed at the sides of the wafer support 51. Side plates for supporting the partition support 52 are attached to the edge of the inner bath bottom lower plate 54 so that the portion to gather the chemical solution has a form of a tub. An input/output line 55 formed at the inner bath bottom lower plate 54 for discharging the chemical solution, is connected to a drainage. In the first embodiment of FIG. 5, a hole 51a is formed at a central portion of the wafer support 51.

Apertures 53 at the sides of the wafer support 51 may be omitted or used in conjunction with the hole 51a. Also covers 46 for covering the partitions to prevent solution from entering therethrough are contemplated by the present invention.

Figure 6:
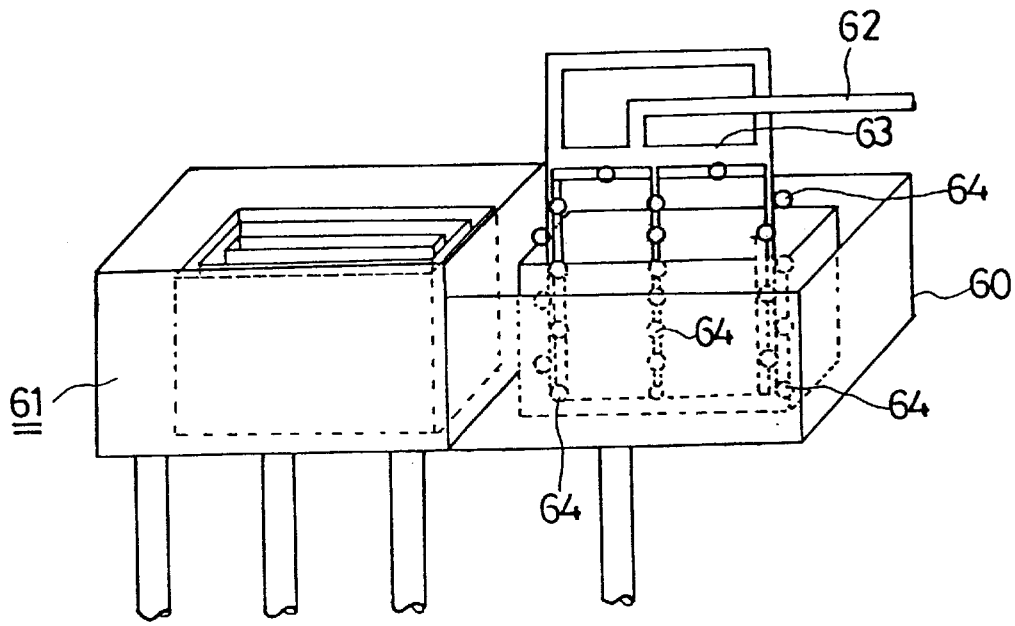
FIGS. 6 and 7 show a cleaning bath and a spray unit of a wafer wet treatment apparatus of the present invention.

According to FIG. 6, which shows another preferred embodiment of the present invention, a movable spray unit and a cleaning bath 60 are installed beside a treatment bath 61, in order to clean a partition for inner bath. Here, the treatment bath is similar to the treatment bath 41 of FIG. 5.

In the spray unit, a cleaning water line 62 for supplying cleaning water is connected to a spray head 63, and multiple branches with a plurality of nozzles 64 are connected to the spray head in order to spray cleaning water in the directions. Thus, as each partition is used and removed, the spray unit cleans that partition in the same way.

Figure 7:
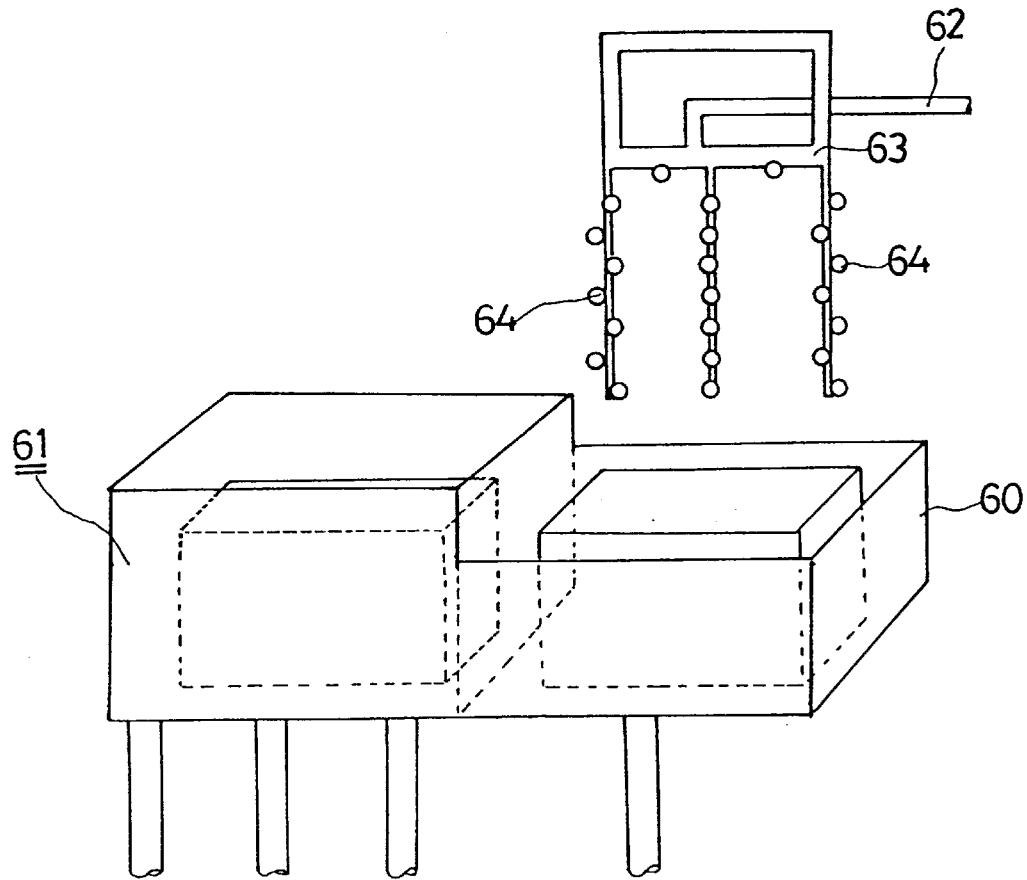

FIG. 7 is a perspective view of the spray unit in the up position.

Figure 8:
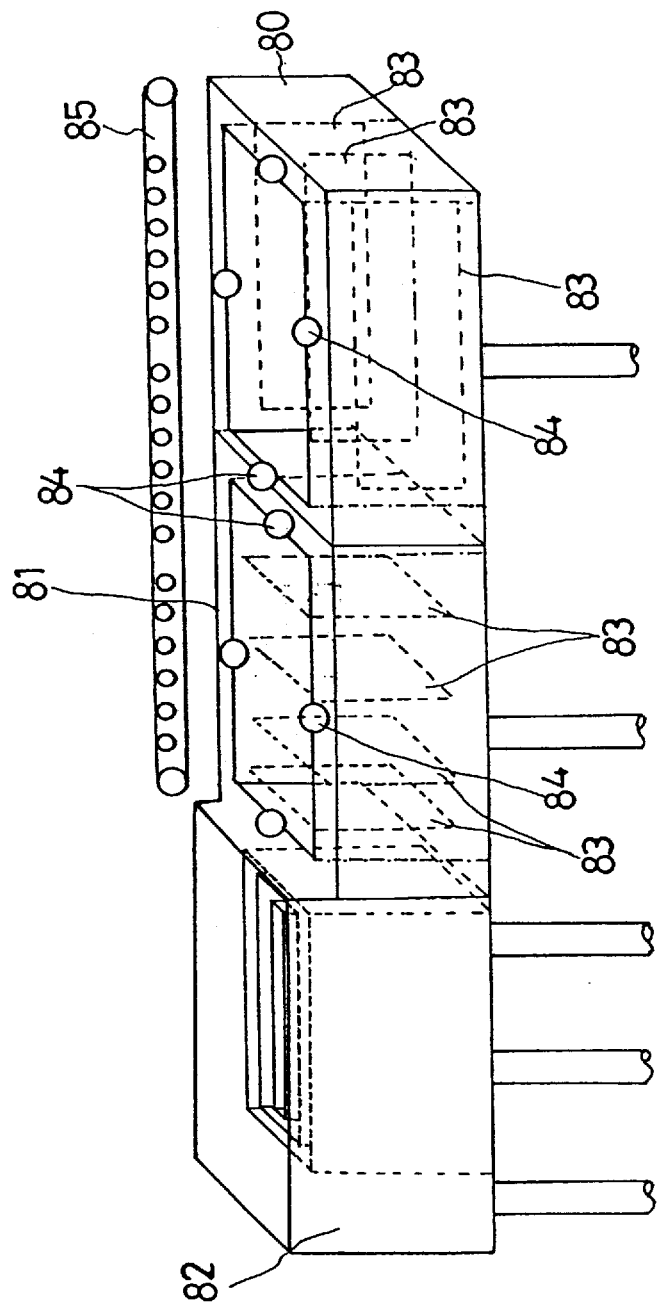
FIG. 8 shows a second embodiment of the wafer wet treatment apparatus of the present invention.

As shown in FIG. 8 depicting still another preferred embodiment of the present invention, two cleaning baths 80 and 81 for cleaning with respective sprays are installed beside a treatment bath 82. Partitions for inner bath are formed so that they are divided into four plates 83, and the divided plates are cleaned in the cleaning baths 80 and 81. Cleaning solution spray nozzles 84 are installed at four sides of the baths for cleaning, respectively (a cleaning solution supply line is not shown). A spray 85 is installed at the top of the apparatus. The size of the bath can be reduced in the present invention having such a construction.

As mentioned in the preferred embodiments of the present invention, a partition support and partitions are attached to each other in order to intercept the flow of chemical solution. That is, the partition support preferably has partition receiving portions, and sealing material is attached to the lower portion of the partitions at the receiving portions so that chemical solution does not flow between the partition support and the partitions.

A conventional chuck or robot may be used for moving the partition or spray.

The following description also relates to a method of using an apparatus of the present invention.

In the apparatus of FIGS. 4 and 5, after all the apparatus is cleaned with distilled water, the largest partition 43 is installed on a partition support 52 in an outer bath 41, and a wafer 5 is mounted, chemical solution is supplied through a supply (output/input) line 41-2, and a necessary process is done. Then the chemical solution used is discharged through a discharge (input/output) line 55.

Next, a partition 44 is installed inside the largest partition 43, a necessary process is done, and the wafer and the bath are cleaned. Such a process is repeated until the smallest partition 45 is used. Therefore, a plurality of middle-sized partitions can be installed between the largest partition 43 and the smallest partition 45, as needed. Thus an inner bath is formed by the use of one partition among multiple partitions, a wet treating process is completely finished, and the wafer and bath are cleaned by a spray. Then the partition used is removed and a new partition is used so that the next process may be performed.

Alternatively, when the required number of partitions are installed from the beginning, whenever one process is finished, the innermost partition can be removed one by one while wet processes are performed.

Various wet treatment can be made according to the apparatus of FIGS. 6 and 8.

In the apparatus of FIG. 6, a partition, which is wet treated with chemicals, is moved to a cleaning bath 60, and then both cleaning process and chemical treatment process can be simultaneously made. That is, after a partition for inner bath is installed and a certain process is performed, the partition is removed. Then, another partition for inner bath for the next process is installed and a new process is performed while the partition used previously is cleaned so that the process can be expedited.

In the apparatus of FIG. 8, partitions are cleaned after separating the partition into individual plates so that the speed and degree of cleaning are enhanced. The opposing side plates of the partitions are separated and cleaned together may use one bath to four baths.

As mentioned above, a wafer support is disposed higher than the bottom of an inner bath in order to prevent the wafer from being contaminated with contaminants by an outlet and a support resulting from a downflow, and a partition installed on the bottom of the inner bath is changed in accordance with various processes so that the problem of contamination caused by the residual chemical solution in the entire process can be solved. Also both wet treatment process and cleaning process are simultaneously made, and processes which are different from one another are made without moving the wafer so that the process efficiency can be maximized.

Figure 9:
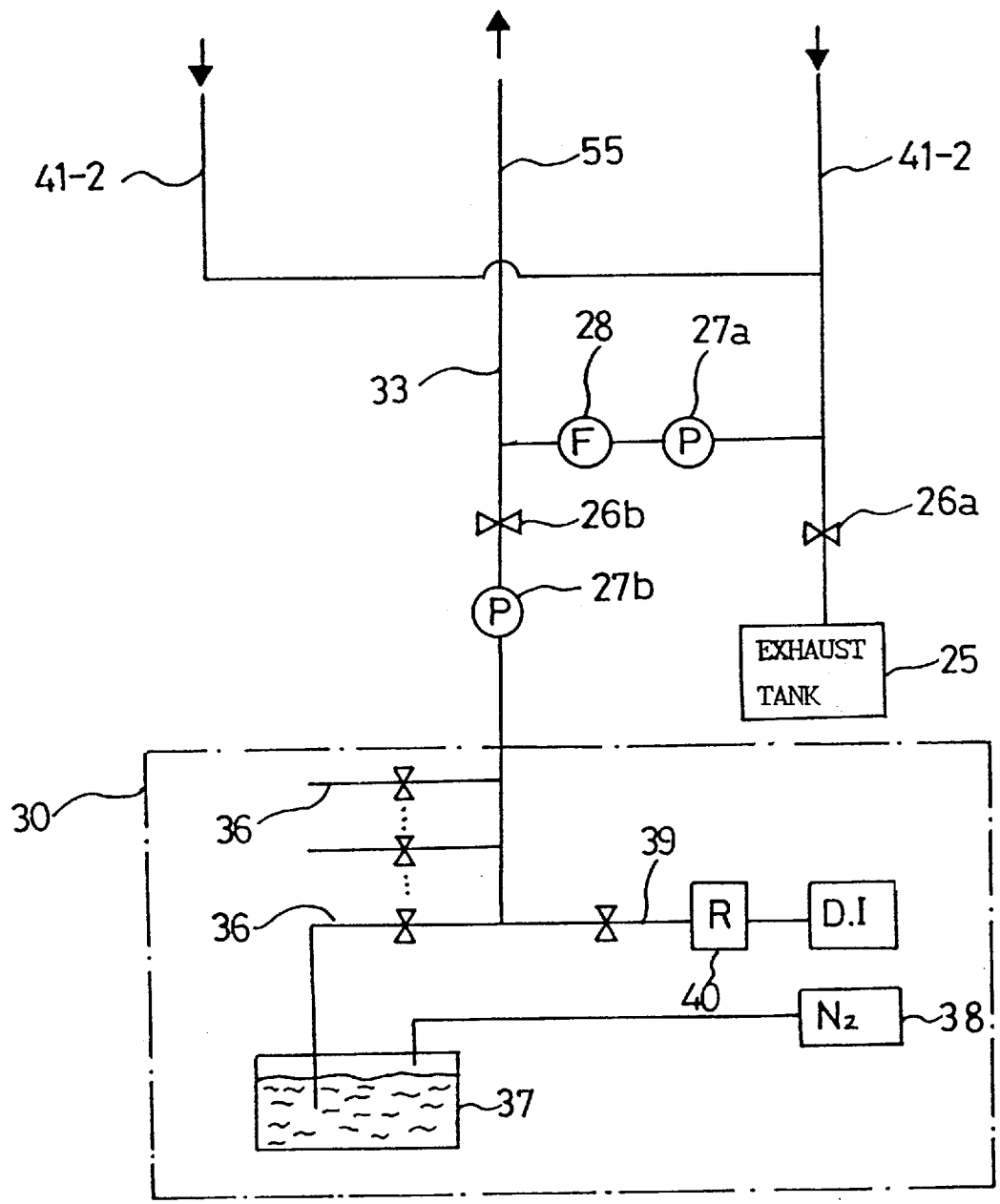
FIG. 9 illustrates an overflow-type wet treatment system in accordance with the present invention.

As shown in FIG. 9, a main solution supply line 33 is connected to a plurality of solution supply lines 36, where the respective solution supply lines 36 are connected to different chemical tanks 37 to supply corresponding solutions to the main solution supply line 33. A pump 27b supplies the solution to the main solution supply line 33. Also, the main solution supply line 33 is connected to a distilled water supply through line 39 and regulator 40. The distilled water supply line 39 and the solution supply lines 36 are controlled by respective control valves.

FIG. 9 also shows the discharge lines 41-2 connected to an exhaust tank 25 controlled by a valve 26a. Thus, when the valve 26a is open, the used solution drains to the tank 25. However, for recirculation mode, the value 26 is closed and the used solution flows to a pump 27a and filter 28 which filters the used solution and sent back to the supply line 55 in accordance with the overflow-type wafer wet treatment system of the present invention. During the recirculation mode, the valve 26b is also closed.

Figure 10:
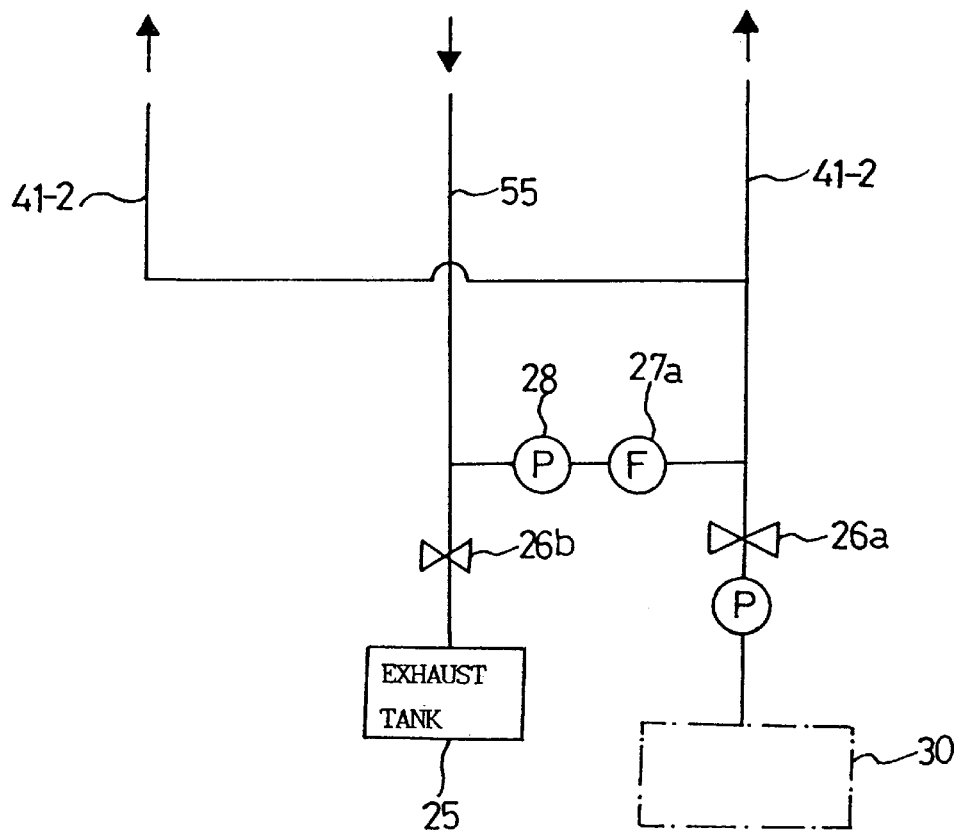
FIG. 10 illustrates a downflow-type wet treatment system in accordance with the present invention.

FIG. 10 shows a similar system as in FIG. 9 but for a downflow-type wafer wet treatment system. The downflow-type wafer wet treatment system is different from the overflow-type shown in FIG. 9 in that the supply line 55 is not a discharge line and the discharge lines 41-2 are now supply lines.

Figure 11:
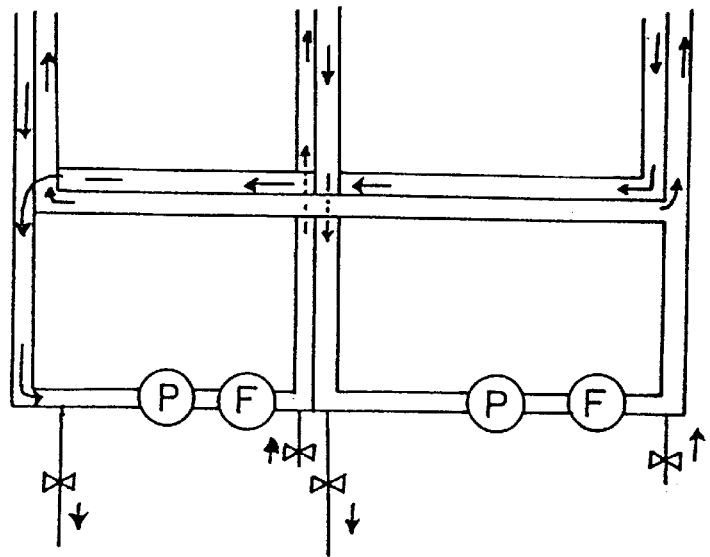
FIG. 11 illustrates a wet treatment system having both down-flow-type and overflow-type capabilities.

FIG. 11 shows a system that combines both the overflow-type and the downflow-type wafer wet treatment systems. In particular, the system shown in FIG. 11 can switch from an overflow mode to a downflow mode and vice-a-versa. Thus, this system is a versatile system that have several advantages including an improved method of reducing contaminants to a minimum and needing only one wafer wet treatment system for both downflow and overflow types. Details of this downflow/overflow system is explained in U.S. patent application Ser. No. 08/606,188, filed on Feb. 23, 1996 by the present inventor, the content of which is incorporated by reference herein.

Figure 12:
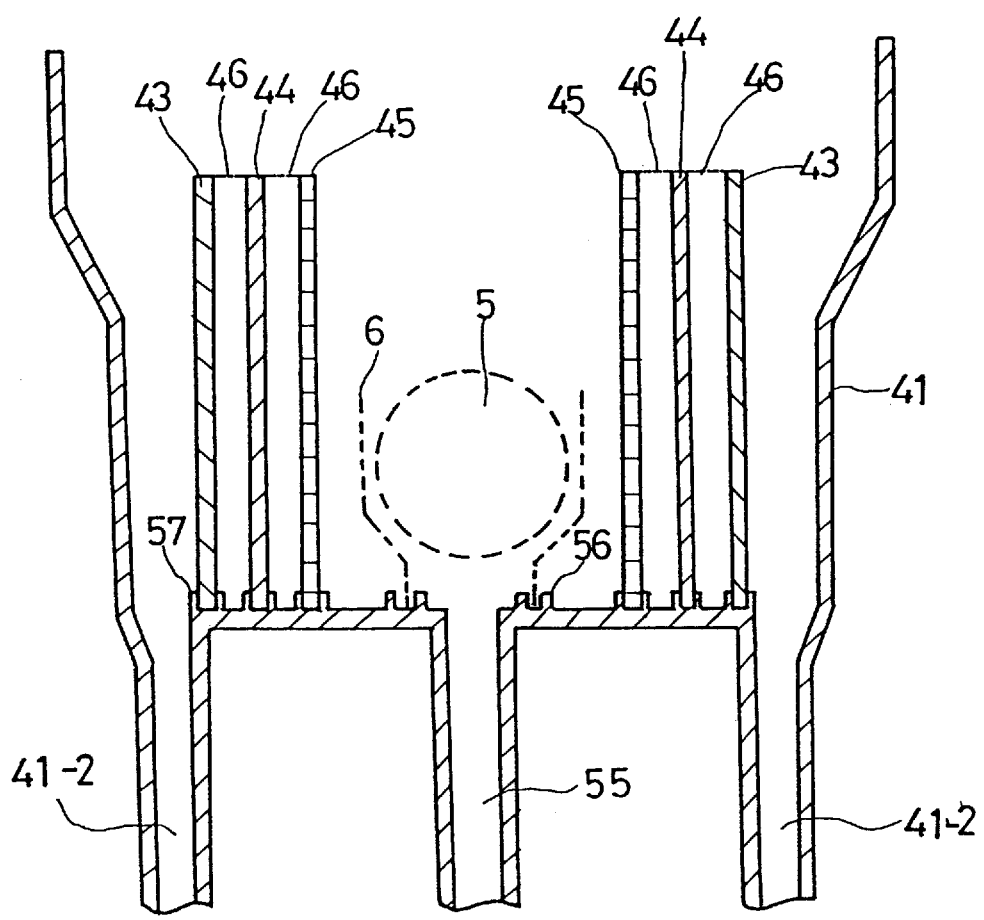
FIG. 12 illustrates a cross-sectional view of a third embodiment of the wafer wet treatment apparatus of the present invention.

FIG. 12 shows a third embodiment of the present invention. The third embodiment is different from the first embodiment shown in FIG. 5 in that the inner bath bottom portion 50 (see FIG. 5) is removed. Thus, the solution flows directly from/to the supply/discharge line 55 without going through the inner bath bottom portion. The third embodiment also may include covers 46 to cover the space between partitions so that contaminants in the solution does not enter and contaminate the partitions to be used in subsequent processes.

Figure 13:
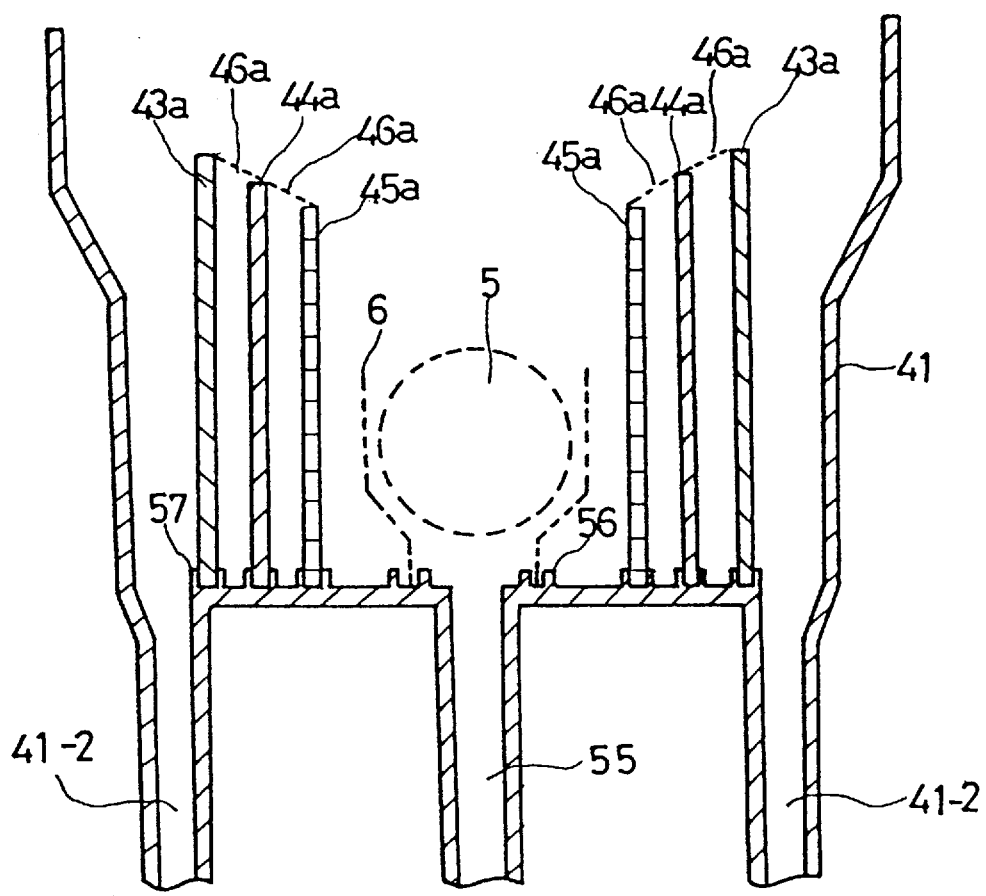
FIG. 13 illustrates a cross-sectional view of a fourth embodiment of the wafer wet treatment apparatus of the present invention.
Figure 14:
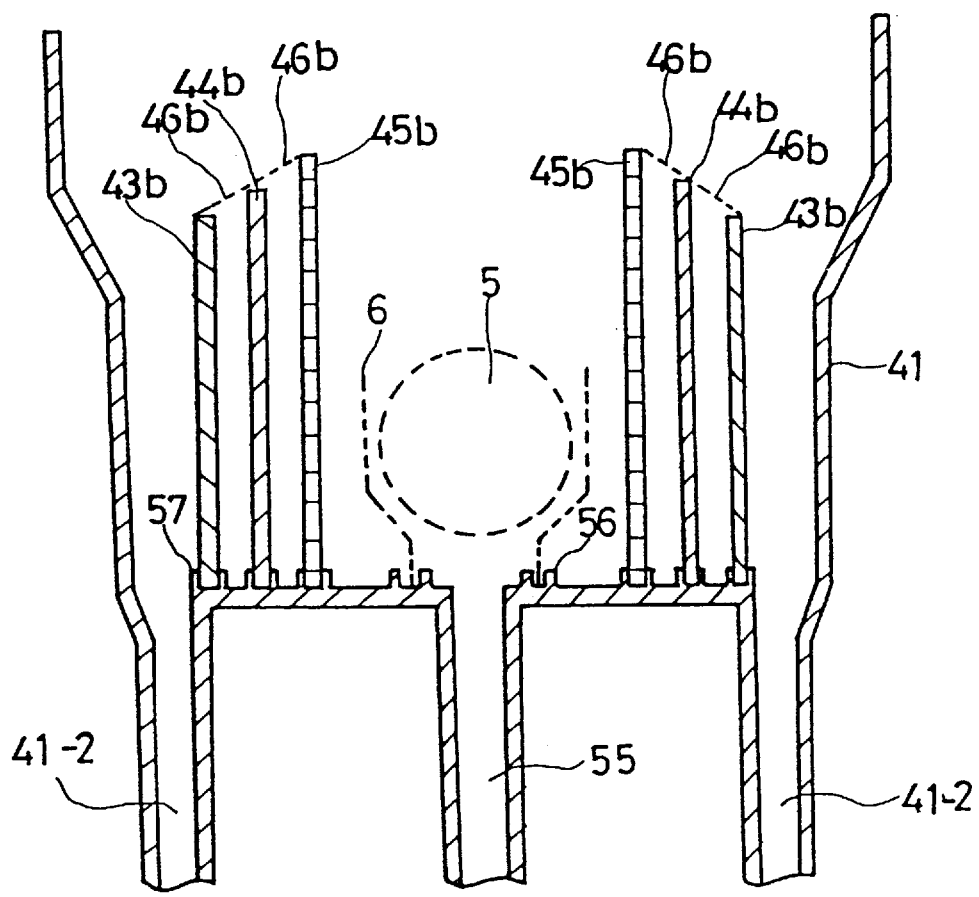
FIG. 14 illustrates a cross-sectional view of a fifth embodiment of the wafer wet treatment apparatus of the present invention.

FIGS. 13 and 14 show fourth and fifth embodiments of the present invention. As shown, the fourth and fifth embodiments are similar to the third embodiment except the partitions have different heights. For example, in the fourth embodiment of FIG. 13, the inner partition 45a is smaller than the outer partitions 43a and 44a, and in the fifth embodiment of FIG. 14, the inner partition 45b is higher than the outer partitions 43b and 44b. Covers 46a and 46b are also contemplated in the fourth and fifth embodiments of the present invention, respectively, to prevent contaminants from entering the space between the partitions. Moreover, the inner bath bottom portion 50 including the wafer support 51 having a hole 51a may be used with the fourth and fifth embodiments, similar to the first embodiment shown in FIG. 5.

In both fourth and fifth embodiments, partition receiving portion 57 may be used to support the partition and prevent leakage of solution therethrough.

Although the present invention has been explained using rectangular partitions, other shapes are contemplated in the present invention. For example, a cylindrical shaped partitions may be used or other polygonal shapes may be used.

Thus, in the present invention, after one partition for inner bath is installed and a certain process is finished, the partition is removed, and when another partition for inner bath for the next process is installed, a new process is made. Here, the chemical solution previously used is all discharged and the inner bath is cleaned with distilled water prior to the next process. Then, a new partition is installed. Therefore, the problem of contamination caused by the residual chemical solution in the entire process can be solved. It is more effective to use the partition for inner bath in accordance with each process. Accordingly, the present invention prevents a wafer from being contaminated by contaminants.

Another process is as follows. In the first process, one partition is used in the inner bath, and in the second process, a new partition is installed in the inner bath, leaving the first partition just as it is. Another partition is installed for the next process.

It will be apparent to those skilled in the art that various modifications and variations can be made in a wafer wet treating apparatus of the present invention without departing from the spirit or scope of the invention. Thus, it is intended that the present invention cover the modifications and variations of this invention provided they come within the scope of the appended claims and their equivalents.

What is claimed is:

1. A wafer wet treatment apparatus comprising:

a first supply/discharge line;

an outer bath connected to the first supply/discharge line;

an inner bath within the outer bath;

a second supply/discharge line connected to the inner bath;

at least one removable partition located within the inner bath and dividing the inner bath into isolated portions; and at least one partition receiving member for holding the at least one removable partition.

2. The wafer wet treatment apparatus according to claim 1, wherein the first supply/discharge line acts as a supply line to the outer bath when the second supply/discharge acts as a discharge line for the inner bath.

3. The wafer wet treatment apparatus according to claim 1, wherein the first supply/discharge line acts as a discharge line for the outer bath when the second supply/discharge acts as a supply line to the inner bath.

4. The wafer wet treatment apparatus according to claim 1, further comprising an intermediate bath below the inner bath connected to the second supply/discharge line.

5. The wafer wet treatment apparatus according to claim 4, wherein the intermediate bath includes:

a partition support portion supporting the at least one partition; and a wafer support portion having a hole supporting a wafer, the wafer support portion being higher than the partition support portion.

6. The wafer wet treatment apparatus according to claim 1, further comprising additional partitions adjacent to the at least one partition and a cover connecting adjacent partitions.

7. The wafer wet treatment apparatus according to claim 6, wherein the partitions have different heights.

8. The wafer wet treatment apparatus according to claim 7, wherein a partition closer to the inner bath is shorter than a partition further from the inner bath.

9. The wafer wet treatment apparatus according to claim 7, wherein a partition closer to the inner bath is taller than a partition further from the inner bath.

10. The wafer wet treatment apparatus according to claim 1, further comprising a third bath and a spray system, the third bath receiving a partition and cleaning the partition with the spray system.

11. The wafer wet treatment apparatus according to claim 1, further comprising third and fourth baths and a spray system, the third and fourth bath receiving portions of a partition and cleaning the portions of the partition with the spray system.

12. The wafer wet treatment apparatus according to claim 1, further comprising a solution supply unit supplying a solution to the first and second supply/discharge lines.

13. The wafer wet treatment apparatus according to claim 1, further comprising a recirculating unit including a filter and a pump coupled to the first and second supply/discharge lines, the recirculating unit receiving used solution from one of the inner and outer baths, filtering the used solution and recirculating the filtered solution.

* * * * *